(12) United States Patent
Rizzolo et al.

(10) Patent No.: US 11,223,008 B2
(45) Date of Patent: Jan. 11, 2022

(54) PILLAR-BASED MEMORY HARDMASK SMOOTHING AND STRESS REDUCTION

(71) Applicant: INTERNATIONAL BUSINESS MACHINES CORPORATION, Armonk, NY (US)

(72) Inventors: Michael Rizzolo, Delmar, NY (US); Theodorus E. Standaert, Clifton Park, NY (US); Ashim Dutta, Menands, NY (US); Dominik Metzler, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 16/697,452

(22) Filed: Nov. 27, 2019

(65) Prior Publication Data

US 2021/0159394 A1 May 27, 2021

(51) Int. Cl.
| | |
|---|---|
| *H01L 27/22* | (2006.01) |
| *H01L 43/02* | (2006.01) |
| *H01L 27/24* | (2006.01) |
| *H01L 43/08* | (2006.01) |
| *H01L 45/00* | (2006.01) |
| *H01L 43/12* | (2006.01) |
| *H01L 43/10* | (2006.01) |

(52) U.S. Cl.
CPC ............ *H01L 43/02* (2013.01); *H01L 27/222* (2013.01); *H01L 27/24* (2013.01); *H01L 43/08* (2013.01); *H01L 43/10* (2013.01); *H01L 43/12* (2013.01); *H01L 45/06* (2013.01); *H01L 45/1233* (2013.01); *H01L 45/1625* (2013.01); *H01L 45/1675* (2013.01)

(58) Field of Classification Search
CPC combination set(s) only.
See application file for complete search history.

(56) References Cited

U.S. PATENT DOCUMENTS

| | | | |
|---|---|---|---|
| 6,743,642 B2 | 6/2004 | Costrini et al. | |
| 8,450,119 B2 | 5/2013 | Torng et al. | |
| 8,722,543 B2 | 5/2014 | Belen et al. | |
| 9,269,893 B2 | 2/2016 | Lu et al. | |
| 9,608,200 B2 | 3/2017 | Shen et al. | |
| 9,887,350 B2 | 2/2018 | Shen et al. | |
| 2004/0228172 A1* | 11/2004 | Rinerson ............ | G11C 13/0007 365/158 |
| 2007/0166840 A1 | 7/2007 | Assefa et al. | |
| 2009/0209050 A1 | 8/2009 | Wang et al. | |
| 2010/0001253 A1 | 1/2010 | Arnold et al. | |
| 2010/0276768 A1 | 11/2010 | Gaidis | |

(Continued)

OTHER PUBLICATIONS

International Search Report for corresponding PCT Application No. PCT/IB2020/060904 dated Feb. 3, 2021.

*Primary Examiner* — Tucker J Wright
(74) *Attorney, Agent, or Firm* — Tutunjian & Bitetto, P.C.; Randall Bluestone (57) ABSTRACT

A method for fabricating a semiconductor device includes forming a conductive shell layer along a memory stack and a patterned hardmask disposed on the memory stack, and etching the patterned hardmask, the conductive shell layer and the memory stack to form a structure including a central core surrounded by a conductive outer shell disposed on a patterned memory stack.

6 Claims, 10 Drawing Sheets

(56) References Cited

U.S. PATENT DOCUMENTS

| | | |
|---|---|---|
| 2011/0121417 A1 | 5/2011 | Li et al. |
| 2013/0119494 A1 | 5/2013 | Li et al. |
| 2015/0287910 A1 | 10/2015 | Lu et al. |
| 2016/0133828 A1 | 5/2016 | Lu et al. |
| 2016/0351238 A1 | 12/2016 | Doyle et al. |
| 2019/0207105 A1* | 7/2019 | Boone .................... H01L 43/10 |

* cited by examiner

PILLAR-BASED MEMORY HARDMASK SMOOTHING AND STRESS REDUCTION

BACKGROUND

The present invention generally relates to semiconductor devices, and more particularly to pillar-based memory devices.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. Examples of non-volatile memory devices include magnetoresistive (MRAM), resistive RAM (ReRAM) and phase-change RAM (PCRAM).

SUMMARY

In accordance with an embodiment of the present invention, a method for fabricating a semiconductor device is provided. The method includes forming a conductive shell layer along a memory stack and a patterned hardmask disposed on the memory stack, and etching the patterned hardmask, the conductive shell layer and the memory stack to form a structure including a central core surrounded by a conductive outer shell disposed on a patterned memory stack.

In accordance with another embodiment of the present invention, a method for fabricating a semiconductor device is provided. The method includes forming a conductive shell layer along a memory stack and a patterned conductive hardmask disposed on the memory stack. The conductive shell layer reduces a roughness of the patterned conductive hardmask. The method further includes etching the patterned conductive hardmask, the conductive shell layer and the memory stack to form a structure including a conductive central core surrounded by a conductive outer shell disposed on a patterned memory stack.

In accordance with yet another embodiment of the present invention, a method for fabricating a semiconductor device is provided. The method includes forming a conductive shell layer along a memory stack and a patterned dielectric hardmask disposed on the memory stack, and etching the patterned dielectric hardmask, the conductive shell layer and the memory stack to form a structure including a dielectric central core surrounded by a conductive outer shell disposed on a patterned memory stack.

In accordance with yet another embodiment of the present invention, a semiconductor device is provided. The device includes a base structure including a first contact of a memory device, and a memory pillar disposed on the base structure. The memory pillar includes a conductive central core having a roughness, and a conductive shell layer surrounding the conductive central core to reduce the roughness. The device further includes an encapsulation layer formed on the memory pillar, and a second contact formed on the memory pillar and the encapsulation layer.

In accordance with yet another embodiment of the present invention, a semiconductor device is provided. The device includes a base structure including a first contact of a memory device, and a memory pillar disposed on the base structure. The memory pillar includes a dielectric central core having a smooth circular profile, and a conductive shell layer surrounding the dielectric central core. The device further includes an encapsulation layer formed on the memory pillar, and a second contact formed on the memory pillar and the encapsulation layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for pillar-based hardmask smoothing and stress reduction in memory devices. The embodiments described herein can provide improved hardmask critical dimension (CD) uniformity, as can be shown from inline CD Scanning Electron Microscope (CD-SEM) results. The embodiments described herein can enable low-stress hardmask (which can be rough) integration to be "fixed" by adding conductive shell layers, thereby reducing stress associated with needing to change hardmasks at the blanket stage. The embodiments described herein can provide for reduced roughness. Roughness can have negative impact on properties of semiconductor devices including, but not limited to, contact resistance, time-dependent dielectric breakdown (TDDB), etc.

Roughness can be defined as deviations of edge points from a smooth reference line. For example, the embodiments described herein can be used to reduce Line Edge Roughness (LER) (e.g., hardmask sidewall roughness), Line Width Roughness (LWR), Contact Edge Roughness (CER) and/or Contact Width Roughness (CWR) measurements. LER and LWR can employ a straight reference line, while CER and CWR can employ an elliptical or circular reference line.

CER can be defined as a 3 sigma (standard deviation) of the horizontal distance of the edge from its fitted reference line. Illustratively, CER can be defined by the following equation:

$$CER = 3 \times \sqrt{\sum_{i=1}^{n} \frac{D(\theta_i)^2}{n-f}}$$

where $D(\theta_i)$ is the perpendicular distance of an edge point to a fitted shape at angle $\theta_i$, n is the number of edge points, and f is the number of degrees of freedom fitted to the edge points. In the case that the fitted reference line is an ellipse, f=5, since the ellipse can be defined by two center coordinates, two lengths corresponding to the semi-major and semi-minor axes, and an orientation angle of the ellipse to an axis. The embodiments described herein can be used to achieve a CER of, e.g., about 1 nm to about 5 nm.

CWR can be defined as a three sigma (standard deviation) of the horizontal distance between top and bottom topographic edge points. Illustratively, for a fitted elliptical reference line, CWR can be defined by the following equation:

$$CWR = 3 \times \sqrt{\sum_{j=1}^{n} \frac{D(\theta_j)^2}{n-1}}$$

where $D(\theta_j)$ is the perpendicular distance (along a fitted bottom ellipse) at angle $\theta_j$ between the top and bottom topographic edge points, and n is the number of edge points.

In one embodiment, a secondary conductive layer can be added after hardmask opening (HMO) to smooth an original hardmask. In this embodiment, a memory pillar (e.g., MRAM, ReRAM, PCRAM) can be provided with a rough conductive central core and a surrounding smoothing shell layer to define the CD. The smoothing shell layer can be deposited after the rough conductive central core is already patterned. The smoothing shell layer can reduce pillar roughness and/or circular edge roughness greater than, e.g., about 25%.

In another embodiment, the original hardmask can be replaced with a dielectric material, and the secondary conductive layer can be added after HMO. In this embodiment, a memory pillar (e.g., MRAM, ReRAM, PCRAM) can be provided with a low stress dielectric central core (e.g., less than, e.g., about 500 MPa) and a surrounding conductive shell to define the CD. The dielectric central core can be patterned with a smooth circular profile.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
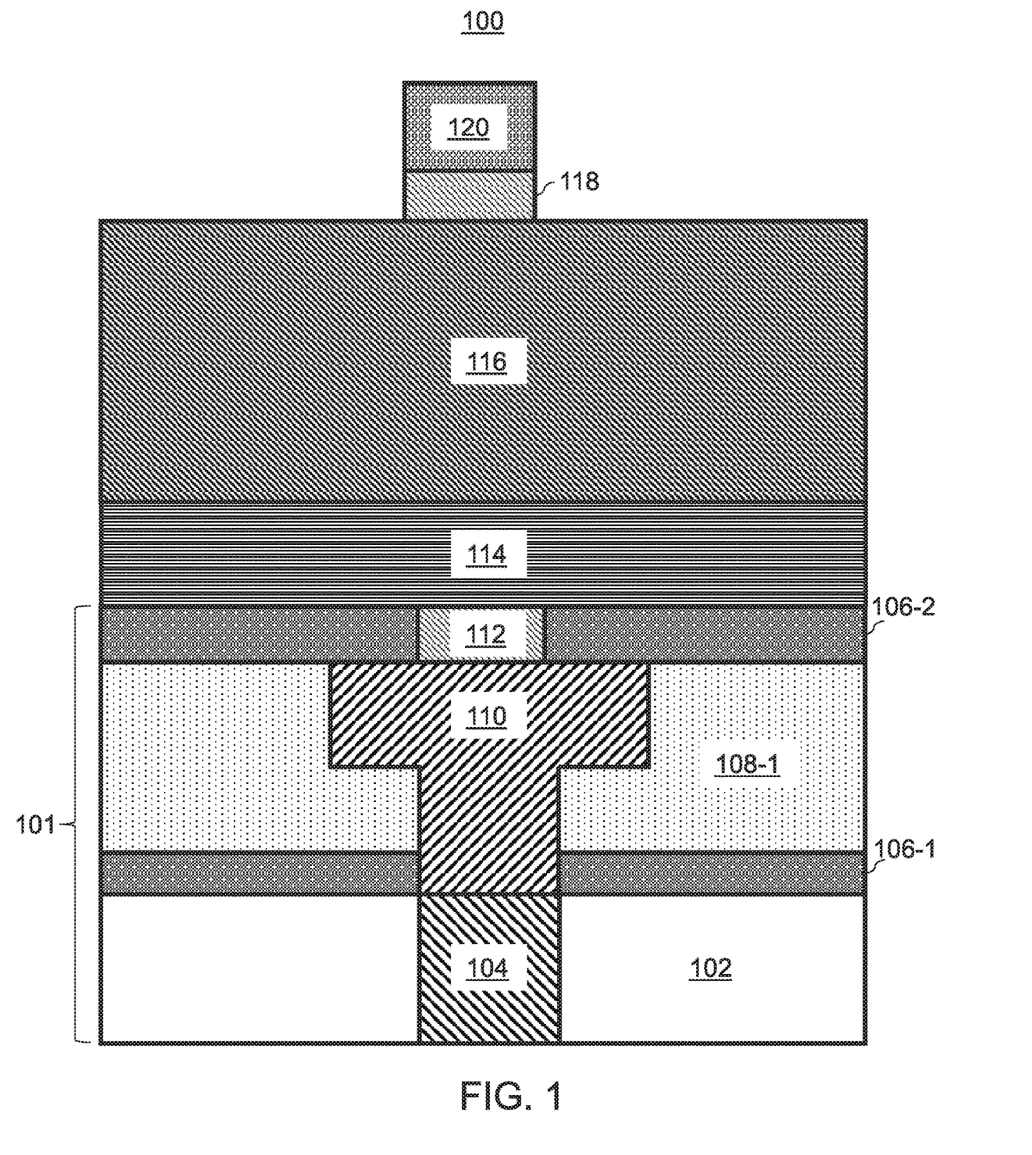
FIG. 1 is a cross-sectional view of the formation of a conductive hardmask on a memory stack during the fabrication of a semiconductor device, in accordance with an embodiment of the present invention.

With reference to FIG. 1, a cross-sectional view of a semiconductor device 100 including a memory device is provided. In one embodiment, the memory device includes an random-access memory (RAM) device. In this illustrative example, a magnetoresistive RAM (MRAM) device is shown. However, the device 100 can include any suitable memory device in accordance with the embodiments described herein. The memory device can be an embedded memory device.

The device 100 includes a base structure 101.

As shown, the base structure 101 can include a substrate 102, circuitry 104 formed within the substrate 102, a dielectric cap layer 106-1, an interconnect 110 formed through the dielectric cap layer 106-1 and within an interlayer dielectric (ILD) layer 108-1, a dielectric cap layer 106-2 disposed on interconnect 110, and a bottom contact landing pad 112. The components of the base structure 101 can include any suitable materials in accordance with the embodiments described herein.

More specifically, the substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide The circuitry 104 can represent middle-of-line (MOL) and front-end-of-line (FEOL) circuitry connected to the MRAM device.

Examples of materials that can be used to form the dielectric cap layers 106-1 and 106-2 include, but are not limited to, Si-based oxides, Si-based nitrides, etc., which can include other elements such as, e.g., C, N, O, etc.

Examples of materials that can be used to form the ILD layer 108-1 include, but are not limited to, low-k dielectric materials, ULK dielectric material, TEOS, etc.

Examples of materials that can be used to form the interconnect 110 include, but are not limited to, copper (Cu), cobalt (Co), TaN/Ta, ruthenium (Ru), and/or other BEOL conductive materials or metals, and the dielectric cap layer can be formed to include, e.g., a silicon nitride material (e.g., SiN), a silicon carbonitride material (e.g., SiCN), a silicon oxynitride material (e.g., SiNO), a silicon carbide material (e.g., SiC), etc.

Examples of materials that can be used to form the bottom contact landing pad 112 include, but are not limited to, Nb, NbN, W, WN, Ta, TaN, Ti, TiN, Cu, Al, Ru, Mo, Cr, V, Pd, Pt, Rh, Sc, Al and other high melting point materials or conductive nitrides.

As further shown, a memory stack 114 is formed across the dielectric layer 106-2 and the bottom contact landing pad 112. In one embodiment, the memory stack 114 includes a magnetic tunnel junction (MTJ) stack. For example, in this embodiment, the memory stack 114 can include seed layer, fixed magnetic layers, free magnetic layers, tunnel barrier (s), oxide cap(s), etc. The tunnel barrier should be sufficiently thin to allow for electrons to tunnel from one ferromagnet into the other in accordance with tunnel magnetoresistance (TMR). For example, the tunnel barrier can have a thickness of, e.g., about a few nanometers. A tunnel barrier can include any suitable insulator material in accordance with the embodiments described herein. Examples of suitable insulator materials include, but are not limited to, magnesium oxide (MgO) and aluminum oxide ($Al_2O_3$).

The memory stack 114 can be fabricated using one or more thin film technology processes. For example, memory stack 114 can be fabricated using one or more of, e.g., sputter deposition, molecular beam epitaxy, pulsed laser deposition, and any type of physical vapor deposition (PVD).

As further shown, a conductive hardmask 116 is formed on the memory stack 114. The conductive hardmask 116 can include any suitable material in accordance with the embodiments described herein. Examples of materials that can be used to form the conductive hardmask include, but are not limited to, Nb, NbN, W, WN, Ta, TaN, Ti, TiN, Ru, Mo, Cr, V, Pd, Pt, Rh, Sc, Al, Cu, and other high melting point metals or conductive nitrides. In one embodiment the conductive hardmask is an MTJ conductive hardmask.

As further shown, lithographic layers including mask 118 and lithography stack 120 are formed on the conductive hardmask 116. The components 118 and 120 are used as lithography layers for patterning the conductive hardmask 116, as will be described in further detail below with reference to FIG. 2. For example, the mask 118 can include a dielectric hardmask and the stack 120 can include, e.g., a resist layer, an organic planarization layer (OPL) and an antireflective coating (ARC) layer.

Figure 2:
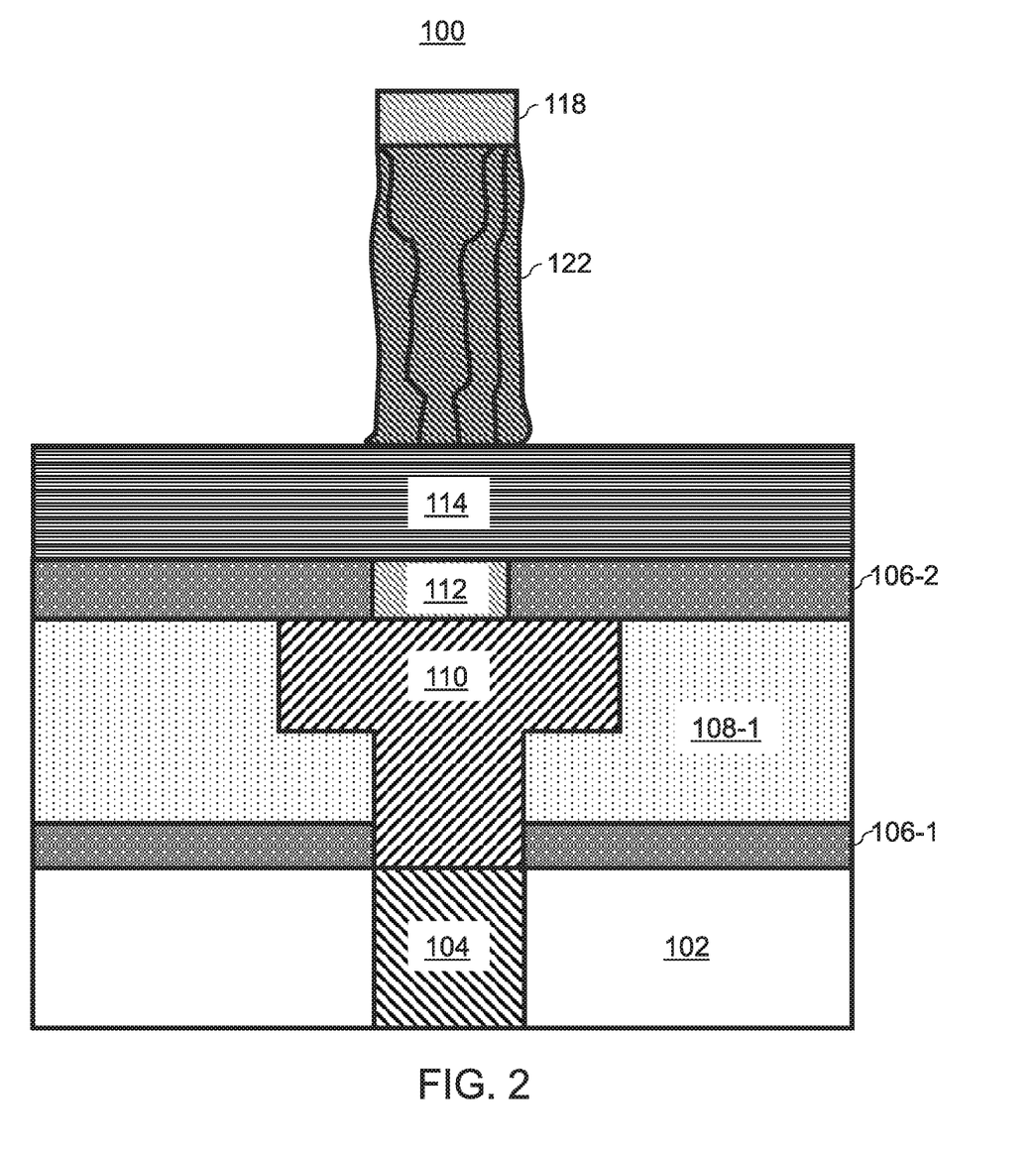
FIG. 2 is a cross-sectional view of a patterned conductive hardmask obtained from the conductive hardmask, in accordance with another embodiment of the present invention.

With reference to FIG. 2, a patterned conductive hardmask 122 is obtained from the conductive hardmask 116 shown in FIG. 1. As shown, the patterned conductive hardmask 122 can be formed to have a roughness, which can be undesirable for the device 100. Any suitable process can be used to obtain the patterned conductive hardmask 122 in accordance with the embodiments described herein.

Figure 3:
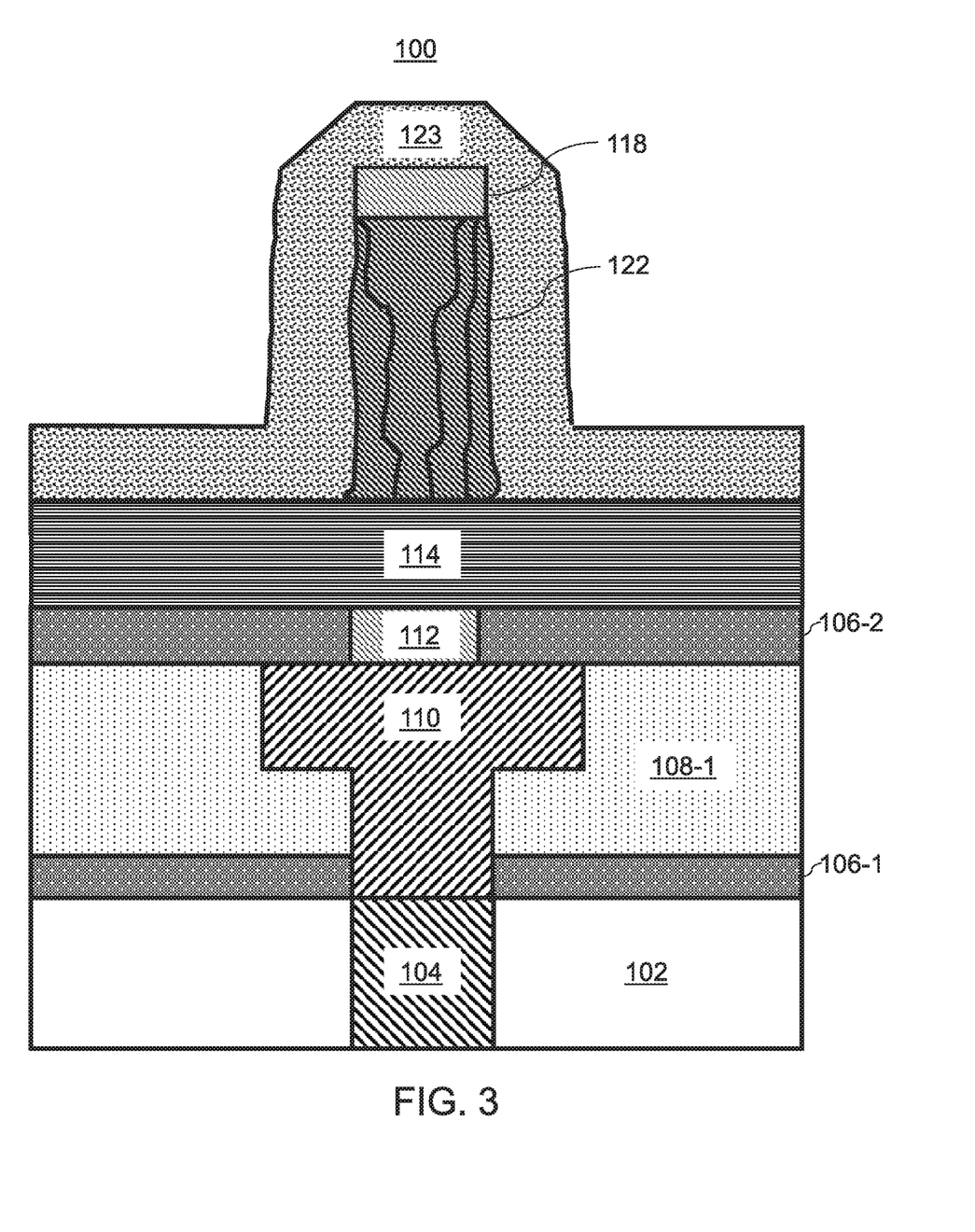
FIG. 3 is a cross-sectional view of the formation of a conductive shell layer on the patterned conductive hardmask during the fabrication of a semiconductor device, in accordance with an embodiment of the present invention.

With reference to FIG. 3, a conductive shell layer 123 is formed along the memory stack 114, the mask 118 and the patterned conductive hardmask 122. In this embodiment, the conductive shell layer 123 can be a smoothing conductive shell layer for reducing the roughness of the patterned conductive hardmask 122. More specifically, irregularities associated with the roughness can be filled in or reduced by the conductive shell layer. The conductive shell layer 123 can reduce memory pillar roughness and/or circular edge roughness by greater than, e.g., about 25%.

Any suitable process can be used to form the conductive shell layer 123 in accordance with the embodiments described herein. Examples of processes that can be used to form the conductive shell layer 123 include, but are not limited to, atomic layer deposition (ALD), physical vapor deposition (PVD), etc. Smoothing can occur by having a deposition thickness greater than about twice the circular edge roughness, deposition with bias (e.g., during PVD) to redeposit material (similar to etchback in lines), and/or rotation during deposition (e.g., like in a PVD deposition chamber).

Figure 4:
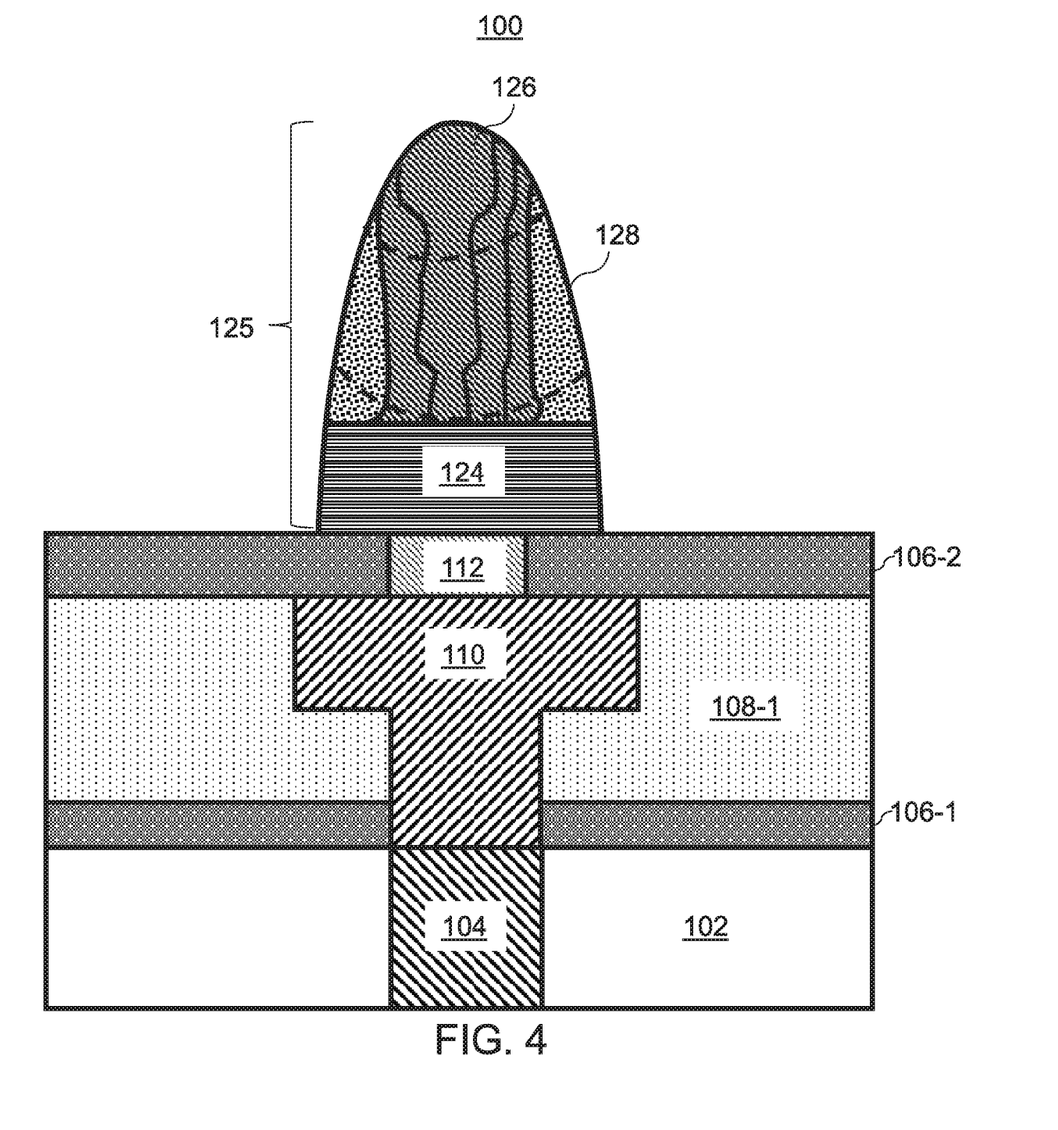
FIG. 4 is a cross-sectional view of the formation of a memory pillar including a conductive central core surrounded by a conductive outer shell during the fabrication of the semiconductor device, in accordance with an embodiment of the present invention.

With reference to FIG. 4, an intermediate structure ("structure") 125 including a conductive central core 126 surrounded by a conductive outer shell 128 disposed on a patterned memory stack 124 is formed. Forming the structure 125 can include etching the patterned conductive hardmask 122, the conductive shell layer 123 and the memory stack 114. Accordingly, the structure 125 can include a rough central core and a smooth outer shell.

As shown, the etching used to form the structure 125 can result in the structure 125 having an oblong or "egg" shape. For example, the structure 125 can have a parabolic-shaped cross-section. In an alternative embodiment, the structure 125 can have a cylindrical shape.

Any suitable etch process can be used to form the structure 125 in accordance with the embodiments described herein. In one embodiment, ion-beam etching (IBE) can be used to form the structure 125. IBE has a natural smoothing capability due to rotation while etching.

Figure 5:
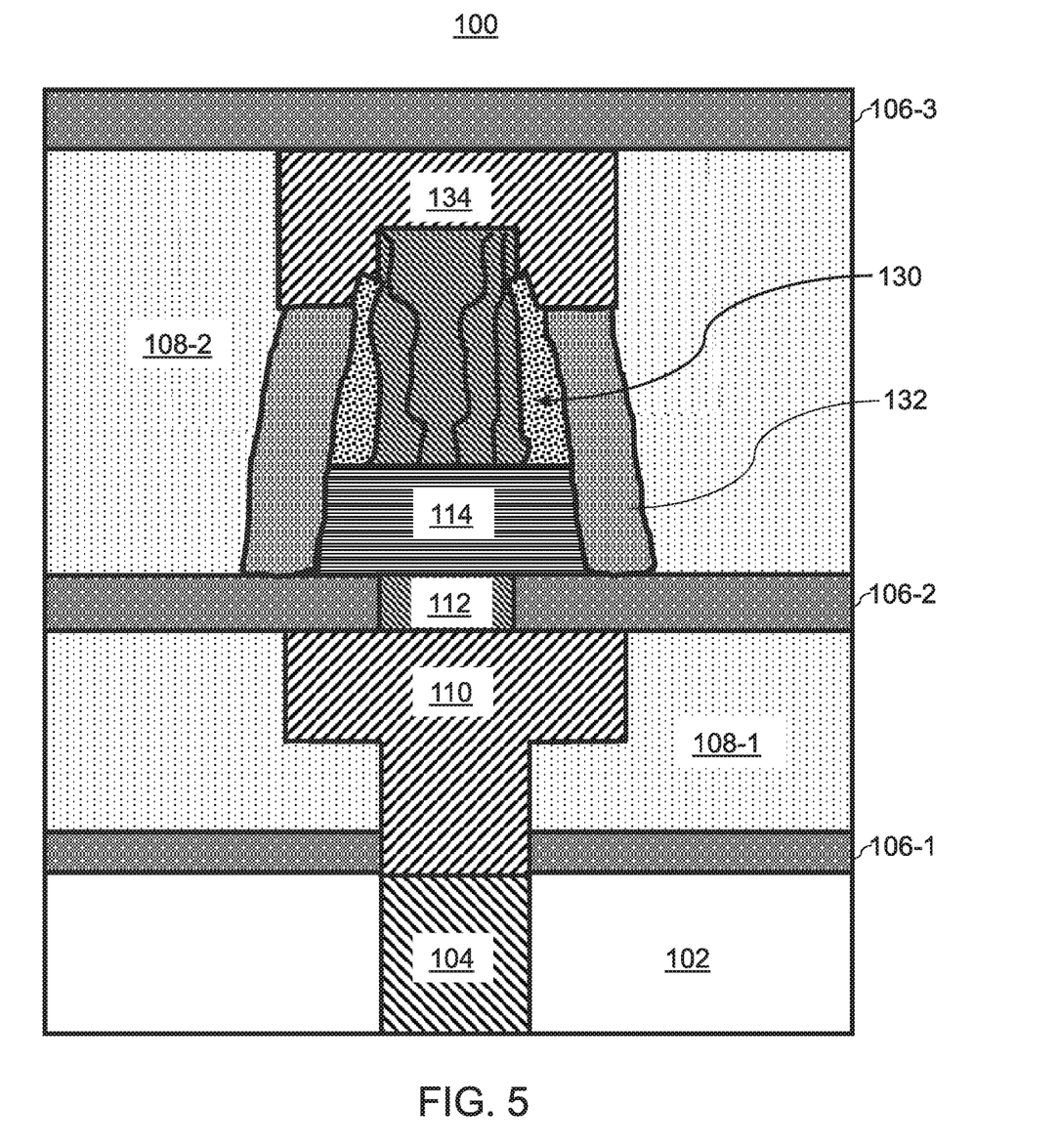
FIG. 5 is a cross-sectional view of additional processing performed during the fabrication of the semiconductor device, in accordance with an embodiment of the present invention.

With reference to FIG. 5, additional processing is performed to form the device 100. As shown, the conductive central core 126 and the conductive outer shell 128 can be etched to form a memory pillar 130, encapsulation layers 132 can be formed about the memory pillar 130, a contact 134 can be formed on the memory pillar 130 and the encapsulation layers 132, an ILD layer 108-2 can be formed on the dielectric cap layer 106-2 up to the top surface of the top contact 134, and a dielectric cap layer 106-3 can formed across the contact 134 and the ILD layer 108-2.

For example, the encapsulation layers 132 can be formed along the sidewalls of the memory pillar 130 and the patterned memory stack 124. Any suitable process can be used to form the encapsulation layers 132 in accordance with the embodiments described herein. The encapsulation layers 132 can be formed to have a thickness depending on pitch. For example, the encapsulation layers 132 can be formed to have a thickness between, e.g., about 5 nm to about 250 nm, depending on the pitch. The encapsulation layers 132 can include any suitable material in accordance with the embodiments described herein. Examples of suitable materials that can be used to form the encapsulation layers 132 include, but are not limited to, a silicon oxide material (e.g., $SiO_2$), a silicon nitride material (e.g., SiN), a silicon carbonitride material (e.g., SiCN), a silicon oxynitride material (e.g., SiNO), a silicon carbide material (e.g., SiC), etc.

Any suitable process can be used to form the contact 134 in accordance with the embodiments described herein. For example, a contact etch that can be used to form the contact 134 can stop on the encapsulation layers, thereby preventing the risk of over-etch to the tunnel barrier of the patterned memory pillar 124. The top contact 134 can include any suitable material in accordance with the embodiments described herein. Examples of materials that can be used to form the top contact 134 include, but are not limited to, copper (Cu), cobalt (Co), TaN/Ta, ruthenium (Ru), and/or other BEOL conductive materials or metals. The contact 134 can include the same material as, or a different material from, the interconnect 110.

Examples of materials that can be used to form the ILD layer 108-2 include, but are not limited to, low-k dielectric materials, ULK dielectric material, TEOS, etc.

The dielectric cap layer 106-3 can be formed to include any suitable material in accordance with the embodiments described herein. Examples of materials that can be used to form the dielectric cap layer 106-3 include, but are not limited to, Si-based oxides, Si-based nitrides, etc., which can include other elements such as, e.g., C, N, O, etc. The dielectric cap layer 106-3 can include the same material as, or a different material from, the dielectric cap layers 106-1 and 160-2.

The embodiments described herein with reference to FIGS. 1-5 provide for the formation of a memory device to promote memory pillar smoothness by forming a conductive central core patterned with a roughness, and surrounding the conductive central core with a smoothing conductive shell layer to reduce the roughness. The embodiments that will now be described below with reference to FIGS. 6-9 provide for the formation of a memory device to promote memory pillar smoothness by forming a hardmask, replacing the hardmask with a dielectric central core patterned with a smooth circular profile, and surrounding the dielectric central core with a conductive shell layer.

Figure 6:
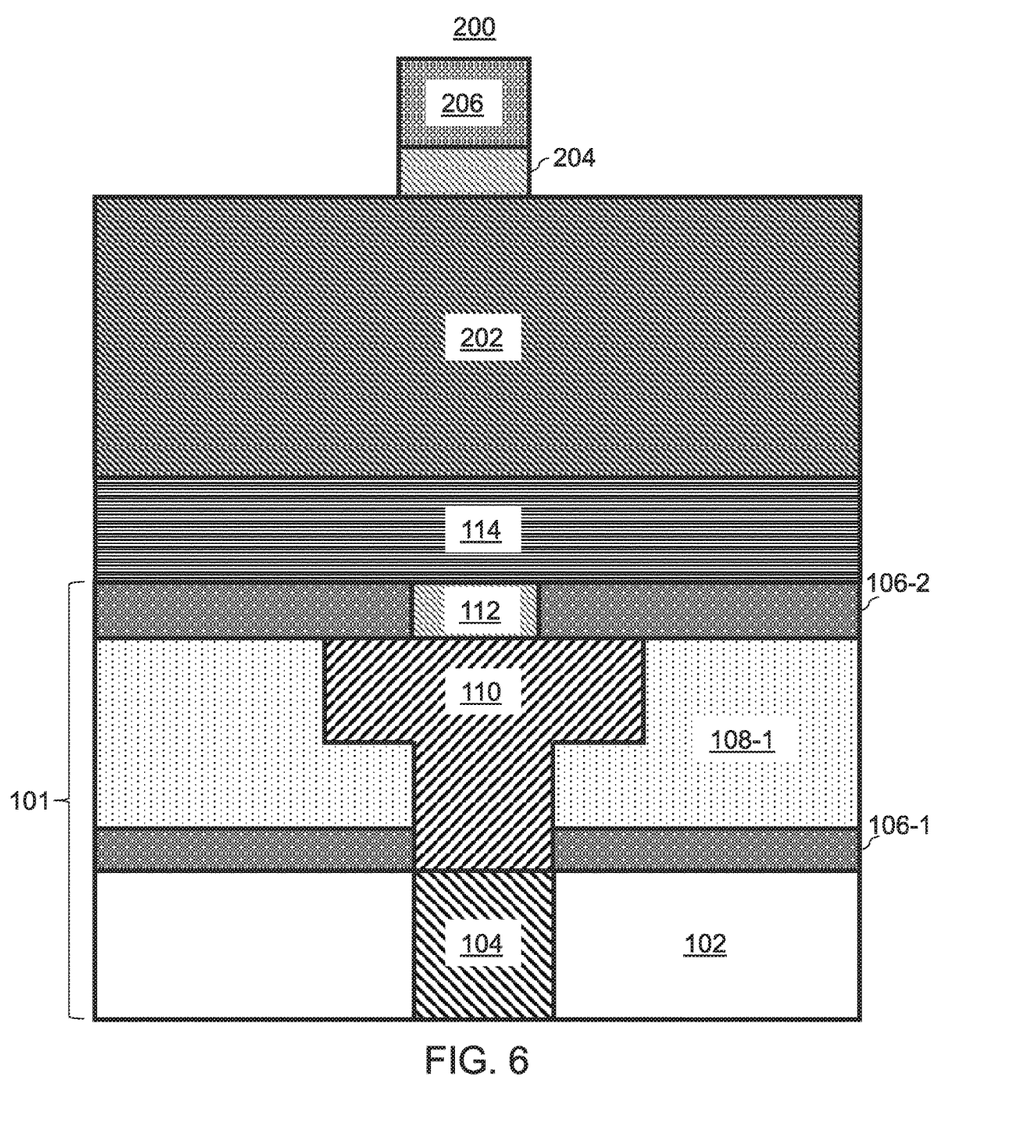
FIG. 6 is a cross-sectional view of the formation of a dielectric hardmask on a memory stack during the fabrication of a semiconductor device, in accordance with another embodiment of the present invention.

With reference to FIG. 6, a cross-sectional view of a semiconductor device 200 including a memory device is provided. In one embodiment, the memory device includes an random-access memory (RAM) device. In this illustrative example, a magnetoresistive RAM (MRAM) device is shown. However, the device 200 can include any suitable memory device in accordance with the embodiments described herein. The memory device can be an embedded memory device.

Similar to the device 100 of FIG. 1, the device 200 includes a base structure 101 including a substrate 102, circuitry 104 formed within the substrate 102, a dielectric cap layer 106-1, an interconnect 110 formed through the dielectric cap layer 106-1 and within an interlayer dielectric (ILD) layer 108-1, a dielectric cap layer 106-2 disposed on interconnect 110, a bottom contact landing pad 112, and a memory stack 114 is formed across the dielectric layer 106-2 and the bottom contact landing pad 112, as described above with reference to FIG. 1.

In contrast to the device 100 of FIG. 1, the device 200 includes a dielectric hardmask 202 formed on the memory stack 114. The dielectric hardmask 202 can include a comparatively low-stress dielectric material. For example, the dielectric material used to form the dielectric hardmask can have a stress level of less than, e.g., about 500 MPa. One purpose of forming the dielectric hardmask from a comparatively low-stress dielectric material is to prevent misalignment of the dielectric pillar due to wafer bow. The dielectric hardmask 202 can include any suitable material in accordance with the embodiments described herein. Examples of suitable dielectric materials that can be used to form the dielectric hardmask include, but are not limited to, TEOS, NBLOK, SiN, etc.

As further shown, lithographic layers including mask 204 and lithography stack 206 are formed on the dielectric hardmask 202. The components 204 and 206 are used as lithography layers for patterning the dielectric hardmask 202, as will be described in further detail below with reference to FIG. 7. For example, the mask 204 can include a dielectric hardmask and the stack 206 can include, e.g., a resist layer, an organic planarization layer (OPL) and an antireflective coating (ARC) layer.

Figure 7:
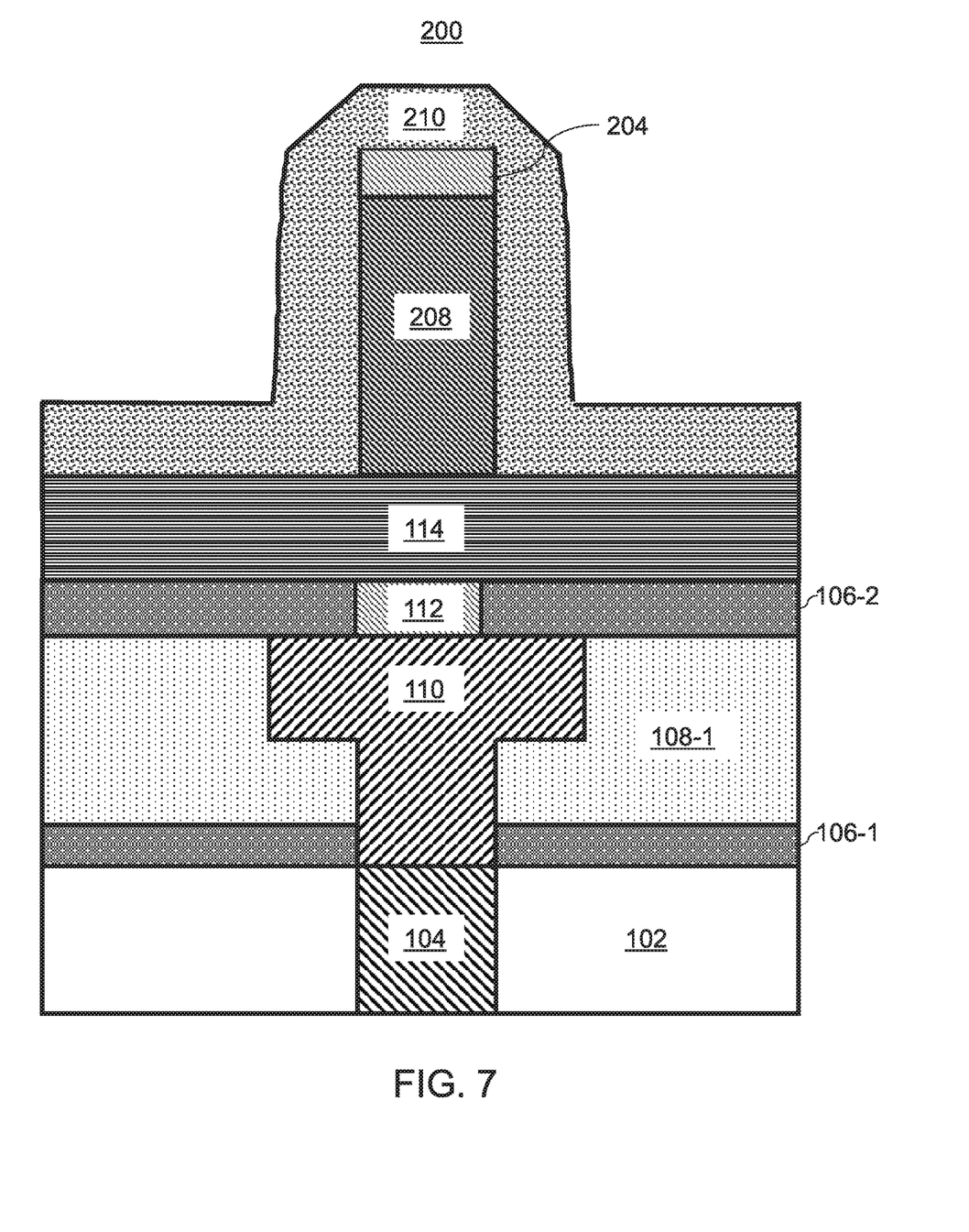
FIG. 7 is a cross-sectional view of a patterned dielectric hardmask obtained from the dielectric hardmask and the formation of a conductive shell layer on the patterned dielectric hardmask, in accordance with another embodiment of the present invention.

With reference to FIG. 7, a patterned dielectric hardmask 208 is obtained from the dielectric hardmask 202 shown in FIG. 7, and a conductive shell layer 210 is formed along the memory stack 114, the mask 204 and the patterned dielectric hardmask 208. As shown, the patterned dielectric hardmask 208 can be formed to have a smoothness. Any suitable process can be used to obtain the patterned dielectric hardmask 122 in accordance with the embodiments described herein and form the conductive shell layer 210 in accordance with the embodiments described herein. Examples of processes that can be used to form the conductive shell layer 210 include, but are not limited to, ALD, PVD, etc.

Figure 8:
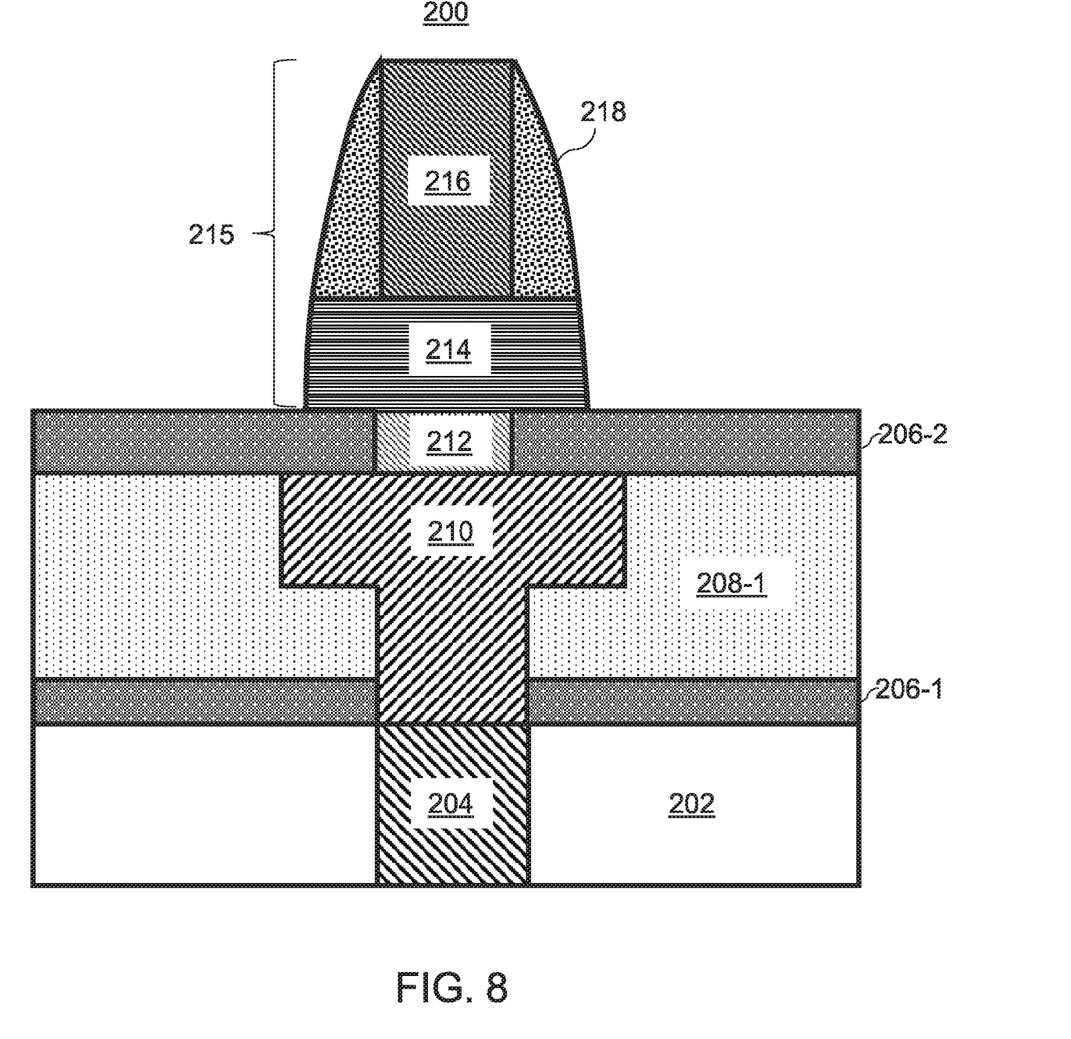
FIG. 8 is a cross-sectional view of the formation of a memory pillar including a dielectric central core surrounded by a conductive outer shell during the fabrication of the semiconductor device, in accordance with another embodiment of the present invention.

With reference to FIG. 8, an intermediate structure ("structure") 215 including a dielectric central core 216 surrounded by a conductive outer shell 218 disposed on a patterned memory stack 214 is formed. Forming the structure 215 can include etching the patterned conductive pillar 208, the conductive shell layer 210 and the memory stack 114 to form the structure 215.

As shown, the etching used to form the structure 215 can result in the structure 215 having an oblong or "egg" shape in which the exposed surface of the dielectric central core 216 is substantially flat. For example, the structure 215 can have a parabolic-shaped cross-section up to the exposed surface of the dielectric central core 216. In an alternative embodiment, the structure 215 can have a cylindrical shape. Additionally, the exposed surface of the dielectric central core 216 can be recessed during the MTJ etching.

Any suitable etch process can be used to form the structure 215 in accordance with the embodiments described herein. In one embodiment, IBE can be used to form the structure 215. As mentioned above with reference to FIG. 4, IBE has a natural smoothing capability due to rotation while etching.

Figure 9:
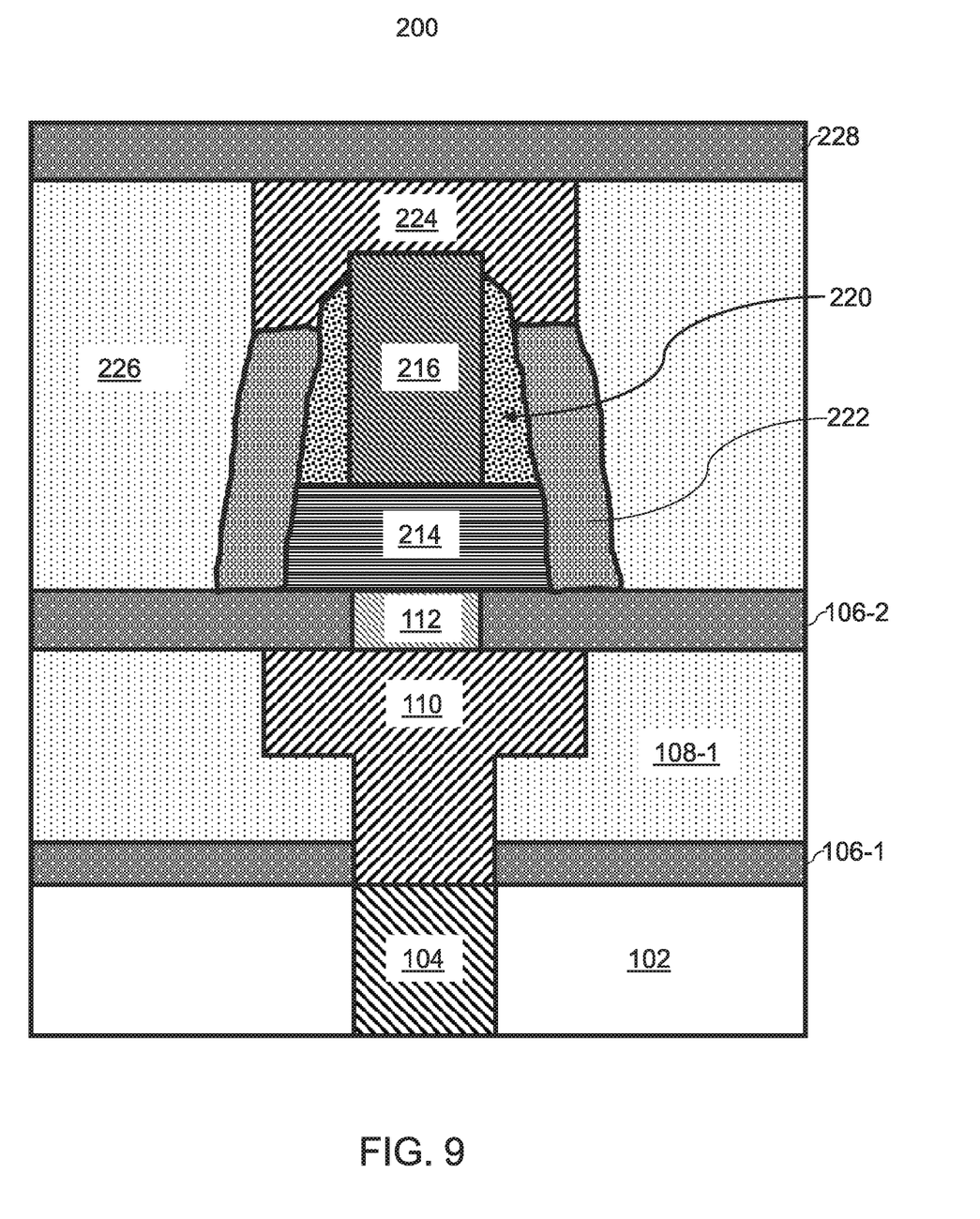
FIG. 9 is a cross-sectional view of additional processing performed during the fabrication of the semiconductor device, in accordance with another embodiment of the present invention.

With reference to FIG. 9, additional processing is performed to form the device 200. As shown, the dielectric central core 216 and the conductive outer shell 218 can be etched to form a memory pillar 220, encapsulation layers 222 can be formed about the memory pillar 220, a contact 224 can be formed on the memory pillar 220 and the encapsulation layers 222, an ILD layer 226 can be formed on the dielectric cap layer 106-2 up to the top surface of the top contact 224, and a dielectric cap layer 228 can formed across the contact 224 and the ILD layer 226.

For example, the encapsulation layers 222 can be formed along the sidewalls of the memory pillar 220 and the patterned memory stack 214. Any suitable process can be used to form the encapsulation layers 222 in accordance with the embodiments described herein. The encapsulation layers 222 can be formed to have a thickness depending on pitch. For example, the encapsulation layers 222 can be formed to have a thickness between, e.g., about 5 nm to about 250 nm, depending on the pitch. The encapsulation layers 22 can include any suitable material in accordance with the embodiments described herein. Examples of suitable materials that can be used to form the encapsulation 222 220 include, but are not limited to, a silicon oxide material (e.g., $SiO_2$), a silicon nitride material (e.g., SiN), a silicon carbonitride material (e.g., SiCN), a silicon oxynitride material (e.g., SiNO), a silicon carbide material (e.g., SiC), etc.

Any suitable process can be used to form the contact 224 in accordance with the embodiments described herein. For example, a contact etch that can be used to form the contact 224 can stop on the encapsulation layers, thereby preventing the risk of over-etch to the tunnel barrier of the patterned memory pillar 214. The top contact 224 can include any suitable material in accordance with the embodiments described herein. Examples of materials that can be used to form the top contact 224 include, but are not limited to, copper (Cu), cobalt (Co), TaN/Ta, ruthenium (Ru), and/or other BEOL conductive materials or metals. The contact 224 can include the same material as, or a different material from, the interconnect 110.

Examples of materials that can be used to form the ILD layer 226 include, but are not limited to, low-k dielectric materials, ULK dielectric material, TEOS, etc.

The dielectric cap layer 228 can be formed to include any suitable material in accordance with the embodiments described herein. Examples of materials that can be used to form the dielectric cap layer 228 include, but are not limited to, Si-based oxides, Si-based nitrides, etc., which can include other elements such as, e.g., C, N, O, etc. The dielectric cap layer 228 can include the same material as, or a different material from, the dielectric cap layers 106-1 and 160-2.

Figure 10:
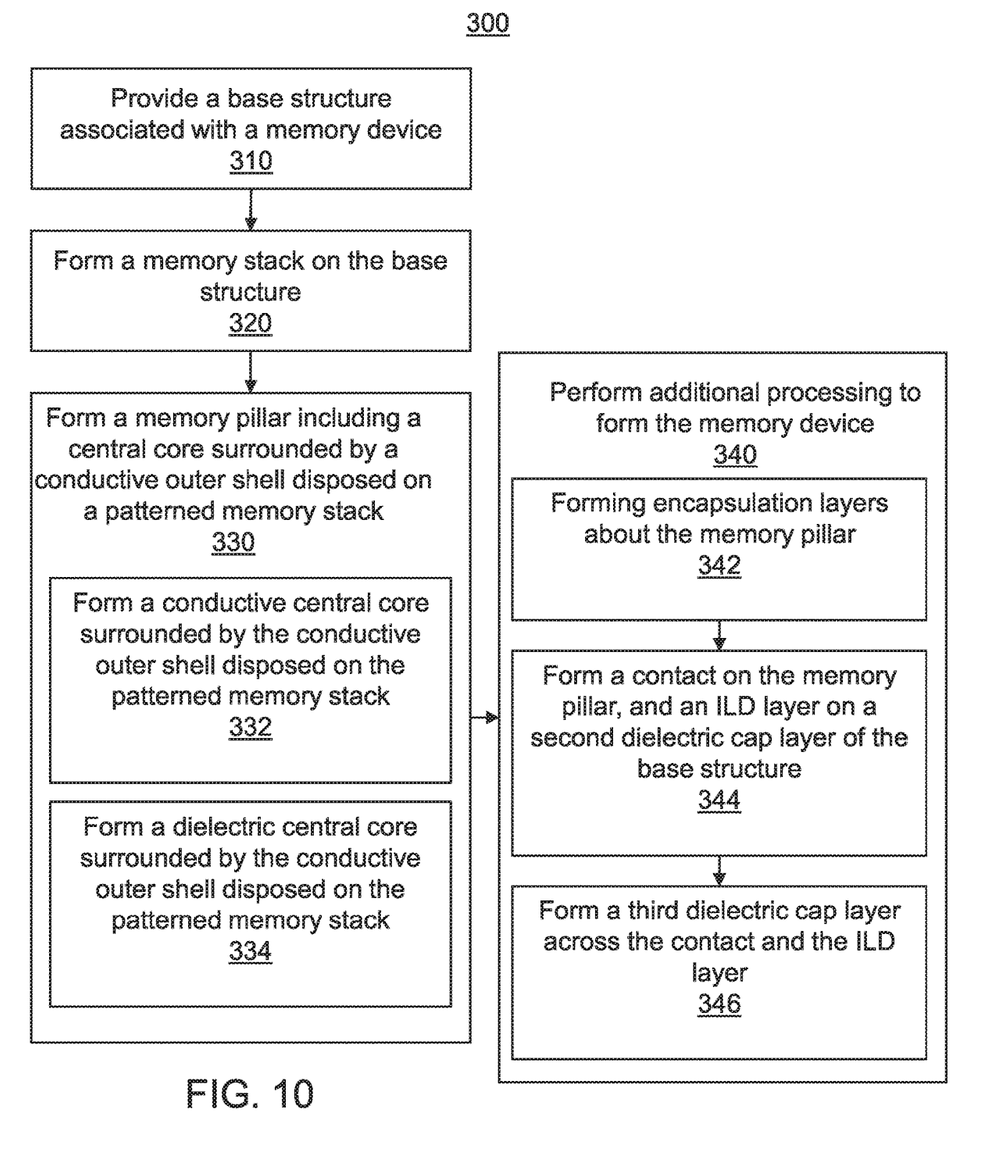
FIG. 10 is a block/flow diagram illustrating a system/method for fabricating a semiconductor device including memory pillar elements, in accordance with an embodiment of the present invention.

With reference to FIG. 10, a block/flow diagram is provided illustrating a system/method 300 for fabricating a semiconductor device.

At block 310, a base structure associated with a memory device is provided. In one embodiment, the memory device includes a RAM device. For example, the memory device can include an MRAM device. However, such an embodiment should not be considered limiting.

The base structure can include circuitry embedded within a substrate connecting to memory devices (e.g., MRAM devices), a first dielectric cap layer on the substrate and the circuitry, a bottom contact formed on the circuit and surrounded by an interlayer dielectric (ILD) layer formed on the first dielectric cap layer, a bottom contact formed on the circuitry, and a bottom contact landing pad formed on the bottom contact and embedded within a second dielectric cap layer formed on the bottom contact and the ILD layer.

The base structure and the components thereof can be formed using any suitable process in accordance with the embodiments described herein. Additionally, the components of the base structure can include any suitable material in accordance with the embodiments described herein.

Examples of materials that can be used to form the bottom contact include, but are not limited to, copper (Cu), cobalt (Co), TaN/Ta, ruthenium (Ru), and/or other BEOL conductive materials or metals, and the dielectric cap layer can be formed to include, e.g., a silicon nitride material (e.g., SiN), a silicon carbonitride material (e.g., SiCN), a silicon oxynitride material (e.g., SiNO), a silicon carbide material (e.g., SiC), and combinations thereof.

Examples of materials that can be used to form the bottom contact landing pad include, but are not limited to, Nb, NbN, W, WN, Ta, TaN, Ti, TiN, Ru, Mo, Cr, V, Pd, Pt, Rh, Sc, Al and other high melting point metals or conductive nitrides.

Examples of materials that can be used to form the ILD layer include, but are not limited to, low-k dielectric materials, ULK dielectric material, TEOS, etc.

Examples of materials that can be used to form the first and second dielectric cap layers include, but are not limited to, Si-based oxides, Si-based nitrides, etc., which can include other elements such as, e.g., C, N, O, etc.

At block 320, a memory stack is formed on the base structure. In the embodiment in which the memory device is an MRAM device, the memory stack can include a magnetic tunnel junction (MTJ) stack. For example, the MTJ stack can include seed layers, fixed magnetic layers, free magnetic layers, tunnel barrier(s), oxide cap(s), etc.

At block 330, a memory pillar including a central core surrounded by a conductive outer shell disposed on a patterned memory stack is formed. The formation of the memory pillar enables memory pillar smoothness. The conductive outer shell can include any suitable material in accordance with the embodiments described herein. Examples of materials that can be used to form the conductive outer shell include, but are not limited to, Nb, NbN, W, WN, Ta, TaN, Ti, TiN, Ru, Mo, Cr, V, Pd, Pt, Rh, Sc, Al, Cu, and other high melting point metals or conductive nitrides.

Forming the memory pillar can include forming a hardmask on the memory stack, and forming, from the hardmask, the central core surrounded by the conductive outer shell. More specifically, forming the memory pillar on the memory stack can include patterning the hardmask to obtain a patterned hardmask, forming a conductive shell layer along the memory stack and the patterned hardmask, etching the patterned hardmask, the conductive shell layer and the memory stack to form a structure including the central core surrounded by the conductive outer shell disposed on the patterned memory stack, and etching the structure to form the memory pillar on the patterned memory stack.

Any suitable process can be used to form the conductive shell layer in accordance with the embodiments described herein. Examples of processes that can be used to form the conductive shell layer include, but are not limited to, atomic layer deposition (ALD), physical vapor deposition (PVD), etc.

Any suitable etch process can be used to etch the conductive central core and the conductive shell layer in accordance with the embodiments described herein. In one embodiment, ion-beam etching (IBE) can be used to form the memory pillar on the memory stack. IBE has a natural smoothing capability due to rotation while etching.

In one embodiment, at block 332, forming the memory pillar can include forming a conductive central core surrounded by the conductive outer shell disposed on the patterned memory stack. In this embodiment, forming the memory pillar can include forming a conductive hardmask on the memory stack, patterning the conductive hardmask to obtain a patterned conductive hardmask, forming a conductive shell layer along the memory stack and the patterned conductive hardmask, etching the patterned conductive hardmask, the conductive shell layer and the memory stack to form a structure including the conductive central core surrounded by the conductive outer shell disposed on the patterned memory stack, and etching the structure to form the memory pillar on the patterned memory stack.

The conductive hardmask can include any suitable material in accordance with the embodiments described herein. Examples of materials that can be used to form the conductive hardmask include, but are not limited to, Nb, NbN, W, WN, Ta, TaN, Ti, TiN, Ru, Mo, Cr, V, Pd, Pt, Rh, Sc, Al, Cu, and other high melting point metals or conductive nitrides. In one embodiment, the conductive hardmask is a MTJ conductive hardmask.

The patterned conductive hardmask can be formed to have a roughness, which can be undesirable for the memory device. In this embodiment, the conductive shell layer can be a smoothing conductive shell layer to reduce the roughness. More specifically, irregularities associated with the roughness can be filled in or reduced by the conductive shell layer. The conductive shell layer can reduce memory pillar roughness and/or circular edge roughness by greater than, e.g., about 25%. Smoothing can occur by having a deposition thickness greater than about twice the circular edge roughness, deposition with bias (e.g., during PVD) to redeposit material (similar to etchback in lines), and/or rotation during deposition (e.g., like in a PVD deposition chamber).

The conductive outer shell can be a smooth outer shell in which the CD of the memory device is defined by the conductive outer shell. Additionally, the etching used to form the memory pillar on the memory stack (e.g., IBE) can result in the memory pillar having an oblong or "egg" shape. For example, the memory pillar can have a parabolic-shaped cross-section. In an alternative embodiment, the intermediate structure can have a cylindrical shape.

In another embodiment, at block 334, forming the memory pillar on the memory stack can include forming a dielectric central core surrounded by the conductive outer shell disposed on the patterned memory stack. In this embodiment, forming the memory pillar can include forming a dielectric hardmask on the memory stack, patterning the dielectric hardmask to obtain a patterned dielectric hardmask, forming a conductive shell layer along the memory stack and the patterned dielectric hardmask, etching the patterned dielectric hardmask, the conductive shell layer and the memory stack to form a structure including the dielectric central core surrounded by the conductive outer shell disposed on the patterned memory stack, and etching the structure to form the memory pillar on the patterned memory stack.

The dielectric hardmask can be formed by depositing a comparatively low-stress dielectric material on the memory stack. For example, the dielectric material used to form the dielectric hardmask can have a stress level of less than, e.g., about 500 MPa. Examples of suitable dielectric materials that can be used to form the dielectric hardmask include, but are not limited to, TEOS, NBLOK, SiN, etc. One purpose of forming the dielectric hardmask from a comparatively low-stress dielectric material is to prevent misalignment of the dielectric pillar due to wafer bow.

The dielectric central core can be formed with a smooth circular profile. Additionally, the conductive outer shell can be a smooth outer shell in which the CD of the memory device is defined by the conductive outer shell. Additionally, the etching used to form the memory pillar on the memory stack (e.g., IBE) can result in the memory pillar having an oblong or "egg" shape in which the exposed surface of the dielectric central core is substantially flat. For example, the memory pillar can have a parabolic-shaped cross-section up to the exposed surface of the dielectric central core. In an alternative embodiment, the intermediate structure can have a cylindrical shape. Additionally, the exposed surface of the dielectric central core can be recessed during the MTJ etching.

At block 340, additional processing is performed to form the memory device.

The additional processing can include, at block 342, forming encapsulation layers about the memory pillar. For example, the encapsulation layers can be formed along the sidewalls of the memory pillar and the memory stack. Any suitable process can be used to form the encapsulation layers in accordance with the embodiments described herein. The encapsulation layers can be formed to have a thickness depending on pitch. For example, the encapsulation layers can be formed to have a thickness between, e.g., about 5 nm to about 250 nm, depending on the pitch. The encapsulation layers can include any suitable material in accordance with the embodiments described herein. Examples of suitable materials that can be used to form the encapsulation layers include, but are not limited to, a silicon oxide material (e.g., $SiO_2$), a silicon nitride material (e.g., SiN), a silicon carbon nitride material (e.g., SiCN), a silicon oxynitride material (e.g., SiNO), a silicon carbide material (e.g., SiC), etc.

The additional processing can further include, at block 344, forming a contact on the memory pillar, and an ILD layer on the second dielectric cap layer.

The contact can be a top contact include any suitable material in accordance with the embodiments described herein. Examples of materials that can be used to form the contact include, but are not limited to, copper (Cu), cobalt (Co), TaN/Ta, ruthenium (Ru), and/or other BEOL conductive materials or metals. The contact can include the same material as, or a different material from, the bottom contact. Any suitable process can be used to form the contact in accordance with the embodiments described herein. For example, a contact etch that can be used to form the contact can stop on the encapsulation layers, thereby preventing the risk of over-etch to the tunnel barrier of the memory pillar.

The ILD layer can include any suitable material in accordance with the embodiments described herein. Examples of materials that can be used to form the ILD layer include, but are not limited to, low-k dielectric materials, ULK dielectric material, TEOS, etc. The ILD layer can include the same material as, or a different material from, the ILD layer of the base structure.

The additional processing can further include, at block 346, forming a third dielectric cap layer across the contact and the ILD layer. The third dielectric cap layer can be formed to include any suitable material in accordance with the embodiments described herein. Examples of materials that can be used to form the third dielectric cap layer include, but are not limited to, Si-based oxides, Si-based nitrides, etc., which can include other elements such as, e.g., C, N, O, etc. The third dielectric cap layer can include the same material as, or a different material from, the first and second dielectric cap layers.

Further details regarding the system/method 300 are provided above with reference to FIGS. 1-9.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a conductive shell layer along a memory stack and a patterned dielectric hardmask disposed on the memory stack; and
    etching the patterned dielectric hardmask, the conductive shell layer and the memory stack to form a structure including a dielectric central core surrounded by a conductive outer shell disposed on a patterned memory stack, wherein the structure includes a cross-section having a parabolic shape.

2. The method of claim 1, further comprising:
    forming the memory stack on a base structure;
    forming a dielectric hardmask on the memory stack; and
    patterning the dielectric hardmask to obtain the patterned dielectric hardmask.

3. The method of claim 1, wherein the dielectric central core has a stress level of less than about 500 MPa.

4. The method of claim 1, wherein etching the patterned dielectric hardmask, the conductive shell layer and the memory stack further includes using ion-beam etching (IBE).

5. The method of claim 1, further comprising etching the dielectric central core and the conductive outer shell to form a memory pillar on the patterned memory stack.

6. The method of claim 5, further comprising:
    forming an encapsulation layer on the memory pillar; and
    forming a second contact on the memory pillar and the encapsulation layer.

* * * * *